US009847139B2

(12) United States Patent
Chen et al.

(10) Patent No.: US 9,847,139 B2
(45) Date of Patent: Dec. 19, 2017

(54) FLASH CHANNEL PARAMETER MANAGEMENT WITH READ SCRUB

(71) Applicant: Seagate Technology LLC, Cupertino, CA (US)

(72) Inventors: Zhengang Chen, San Jose, CA (US); Erich F. Haratsch, Bethlehem, PA (US)

(73) Assignee: SEAGATE TECHNOLOGY LLP, Cupertino, CA (US)

( * ) Notice: Subject to any disclaimer, the term of this patent is extended or adjusted under 35 U.S.C. 154(b) by 889 days.

(21) Appl. No.: 13/632,294

(22) Filed: Oct. 1, 2012

(65) Prior Publication Data
US 2014/0095110 A1 Apr. 3, 2014

(51) Int. Cl.
*G06F 19/00* (2011.01)
*G11C 29/02* (2006.01)
*G11C 16/00* (2006.01)
*G11C 29/04* (2006.01)

(52) U.S. Cl.
CPC .......... *G11C 29/021* (2013.01); *G11C 29/028* (2013.01); *G11C 16/00* (2013.01); *G11C 2029/0409* (2013.01)

(58) Field of Classification Search
CPC ............... G06F 11/106; G06F 11/1068; G06F 12/0246; G06F 2212/7201; G11C 16/0483; G11C 16/3418; G11C 16/3431; G11C 16/04; G11C 29/04; G11C 16/00; G11C 29/02
See application file for complete search history.

(56) References Cited

U.S. PATENT DOCUMENTS

| | | | | |
|---|---|---|---|---|
| 5,734,612 A | * | 3/1998 | Yoshikawa | G11C 16/26 365/185.13 |
| 7,477,547 B2 | | 1/2009 | Lin | 365/185.09 |
| 7,576,557 B1 | * | 8/2009 | Tseng et al. | 326/9 |
| 8,145,984 B2 | | 3/2012 | Sommer et al. | 714/797 |
| 2005/0283566 A1 | * | 12/2005 | Callaghan | G06F 12/1408 711/104 |
| 2008/0239808 A1 | * | 10/2008 | Lin | 365/185.09 |
| 2009/0154250 A1 | * | 6/2009 | Lin | G11C 16/20 365/185.22 |
| 2009/0172335 A1 | | 7/2009 | Kulkarni et al. | 711/170 |

(Continued)

*Primary Examiner* — Sujoy Kundu
*Assistant Examiner* — Lisa Peters
(74) *Attorney, Agent, or Firm* — Christopher P. Maiorana, PC

(57) ABSTRACT

An apparatus having a first circuit and a second circuit is disclosed. The first circuit may be configured to generate statistics of a region of a memory circuit as part of a read scrub of the region. The region may have multiple units of data. The memory circuit may be configured to store the data in a nonvolatile condition. The second circuit is generally configured to (i) track one or more parameters of the region based on the statistics, (ii) determine when one or more of the statistics of one or more outliers of the units in the region exceeds a corresponding threshold and (iii) track the parameters of the outlier units separately from the parameters of the region in response to exceeding the corresponding threshold. The parameters generally control one or more reference voltages used to read the data from the region.

20 Claims, 7 Drawing Sheets

(56) References Cited

U.S. PATENT DOCUMENTS

| | | | |
|---|---|---|---|
| 2010/0023672 A1* | 1/2010 | Gorobets | G06F 12/0246 711/103 |
| 2010/0023800 A1* | 1/2010 | Harari et al. | 714/2 |
| 2010/0131809 A1 | 5/2010 | Katz | 714/719 |
| 2012/0054413 A1 | 3/2012 | Brandt | 711/103 |
| 2012/0079190 A1 | 3/2012 | Colgrove et al. | 711/114 |

* cited by examiner

FLASH CHANNEL PARAMETER MANAGEMENT WITH READ SCRUB

The present application is related to co-pending U.S. application Ser. No. 13/464,433, filed May 4, 2012, co-pending U.S. application Ser. No. 13/533,130, filed Jun. 26, 2012, and co-pending international application PCT/US2012/021682, international filing date of Jan. 18, 2012, all of which are incorporated by reference.

FIELD OF THE INVENTION

The present invention relates to nonvolatile memories generally and, more particularly, to a method and/or apparatus for implementing flash channel parameter management with read scrub.

BACKGROUND OF THE INVENTION

Different threshold voltage levels map to different bits in nonvolatile memories. Due to noise, the actual threshold voltage levels for each state within a group of cells follow a distribution. Controllers of the nonvolatile memory will model the threshold voltage distribution of each state. Conventional controllers use a parametric model for a "flash channel". The flash channel parameters change with use conditions, such as program/erase cycles and retention. Therefore, the controllers track the channel parameters over time. However, the tracking operations consume bandwidth to the memory and utilize storage space for maintaining the channel parameters.

It would be desirable to implement a flash channel parameter management with read scrub.

SUMMARY OF THE INVENTION

The present invention concerns an apparatus having a first circuit and a second circuit. The first circuit may be configured to generate statistics of a region of a memory circuit as part of a read scrub of the region. The region may have multiple units of data. The memory circuit may be configured to store the data in a nonvolatile condition. The second circuit is generally configured to (i) track one or more parameters of the region based on the statistics, (ii) determine when one or more of the statistics of one or more outliers of the units in the region exceeds a corresponding threshold and (iii) track the parameters of the outlier units separately from the parameters of the region in response to exceeding the corresponding threshold. The parameters generally control one or more reference voltages used to read the data from the region.

The objects, features and advantages of the present invention include providing a method and/or apparatus for implementing flash channel parameter management with read scrub that may (i) reduce read error rates, (ii) track channel parameters for multiple data groups, (iii) track the channel parameters during read scrubs, (iv) operate with nonvolatile memory, such as NAND flash memory, (v) operate with solid state drives, (vi) adjust a reference voltage used by a memory to read data, (vii) operate with different data group granularity and/or (viii) be implemented in an integrated circuit.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Some embodiments of the present invention may provide a hybrid channel parameter management method (or process, or technique, or scheme) suitable for use in a controller of a solid state drive (e.g., SSD). The controller may select a coarse granularity of a region (e.g., an R-block) for channel parameters of the SSD nonvolatile memories. Such channel parameters may be referred to as "average channel parameters". An R-block is generally a combination of blocks combined to form a redundant array of silicon independent elements, similar to a redundant array of independent disks for magnetic media. At another smaller (finer) granularity, the controller generally identifies outlier units (e.g., blocks) that deviate from the average parameters by a large amount. The controller may subsequently use separate channel parameters for each of the outlier units. Such channel parameters may be referred to as "outlier channel parameters". Locations of outlier units may also be determined and stored. Over a life of an SSD, an outlier identification task may be run together with some or all of the read scrub instances, which may be run regularly as a background task. The outlier units within each average granularity may be identified and updated over time.

In the controller, the granularity of the channel parameters is generally defined as a group of memory cells that share a set of channel parameters. For example, each region (R-block) and each unit (block), generally has a respective set of channel parameters. The controller may vary the granularity used with the nonvolatile memories. The choice of granularity should reasonably reflect how the read (flash) channels of the SSD change with use conditions. For example, an R-block granularity may be a reasonable size because all of the blocks in a single R-block generally have the same program/erase (e.g., P/E) cycle count. For finer granularity, more computational cost may be consumed in the channel tracking. Using a finer granularity size may result in more reads from the nonvolatile memories to obtain data samples within each unit. Furthermore, finer granularity uses more memory to store the channel parameters for the entire SSD. For example, if a collection of channel parameters is maintained for each block, a 256 gigabyte SSD with 2 megabytes per block has approximately 128,000 sets (or collections) of channel parameters. If each parameter sets occupies 8 bytes, a total storage capacity of approximately 1 megabyte should be allocated to buffer the channel parameters on-chip or store the parameters in a flash memory.

Figure 1:
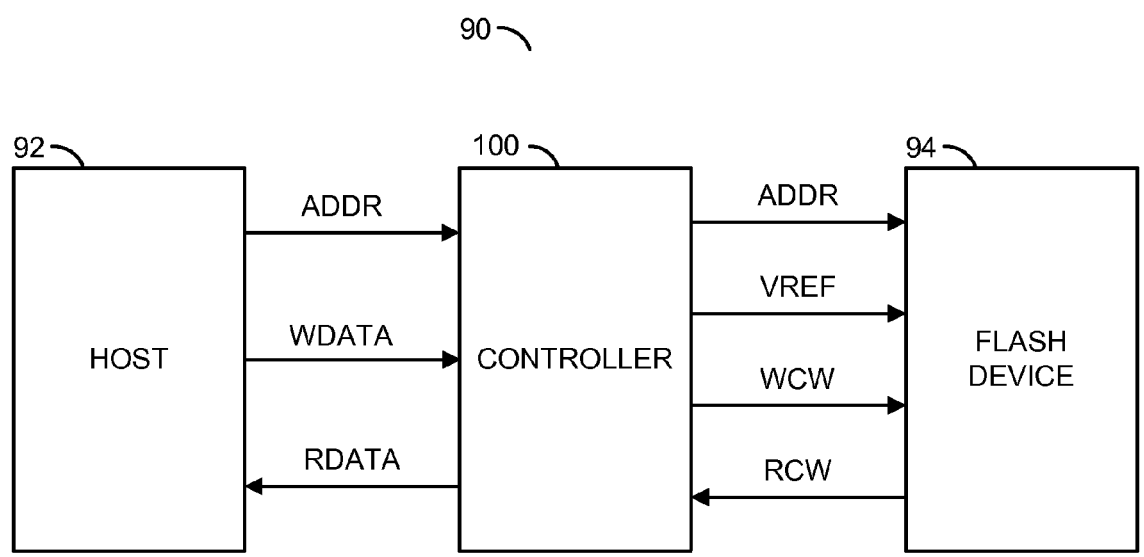
FIG. 1 is a block diagram of an example apparatus.

Referring to FIG. 1, a block diagram of an example apparatus 90 is shown. The apparatus (or circuit or device or integrated circuit) 90 may implement a computer having a nonvolatile memory circuit. The apparatus 90 generally comprises a block (or circuit) 92, a block (or circuit) 94 and a block (or circuit) 100. The circuits 92 to 100 may represent modules and/or blocks that may be implemented as hardware, software, a combination of hardware and software, or other implementations.

A signal (e.g., ADDR) may be generated by the circuit 92 and received by the circuits 94 and 100. The signal ADDR may implement an address signal used to access data in the circuit 94. A signal (e.g., VREF) may be generated by the circuit 100 and presented to the circuit 94. The signal VREF may convey and/or specify a reference voltage used by the circuit 94 to read data. A signal WDATA may be generated by the circuit 92 and presented to the circuit 100. The signal WDATA generally conveys write data to be written into the circuit 100. A signal (e.g., WCW) may be generated by the circuit 100 and transferred to the circuit 94. The signal WCW may carry error correction coded (e.g., ECC) write codewords written into the circuit 94. A signal (e.g., RCW) may be generated by the circuit 94 and received by the circuit 100. The signal RCW may carry ECC codewords read from the circuit 94. A signal (e.g., RDATA) may be generated by the circuit 100 and presented to the circuit 92. The signal RDATA may carry error corrected versions of the data in the signal RCW.

The circuit 92 may implement a host circuit. The circuit 92 is generally operational to read and write data to and from the circuit 94. When reading or writing, the circuit 92 may place an address value in the signal ADDR to identify which set of data is to be written or to be read from the circuit 94. The write data may be presented in the signal WDATA The read data requested by the circuit 92 may be received via the signal RDATA.

The circuit 94 may implement a nonvolatile memory circuit. In some embodiments, the circuit 94 may be a NAND flash device. In other embodiments, the circuit 94 may be implemented as all or a portion of a solid state drive having one or more nonvolatile devices. The circuit 94 is generally operational to store data in a nonvolatile condition. When data is read from the circuit 94, the circuit 94 may access a set of data (e.g., multiple bits) identified in the signal ADDR. An exhibited threshold voltage of each memory cell within the accessed set may be compared with the reference voltage specified in the signal VREF. For each memory cell where the reference voltage is above the threshold voltage, one or more logical values may be sensed. For each memory cell where the reference voltage is below the threshold voltage, one or more different logical values may be sensed.

In some embodiments, the circuit 94 may be implemented as a single-level cell (e.g., SLC) type circuit. An SLC type circuit generally stores a single bit per memory cell (e.g., a logical 0 or 1). In other embodiments, the circuit 94 may be implemented as a multi-level cell (e.g., MLC) type circuit. An MLC type circuit is generally capable of storing multiple (e.g., two) bits per memory cell (e.g., logical 00, 01, 10 or 11). In still other embodiments, the circuit 94 may implement a triple-level cell (e.g., TLC) type circuit. A TLC circuit may be able to store multiple (e.g., three) bits per memory cell (e.g., a logical 000, 001, 010, 011, 100, 101, 110 or 111).

The signal ADDR generally spans an address range of the circuit 94. The address range may be divided into multiple groups (or regions). Each group may be divided into one or more sets of data. Each set of data generally incorporates multiple memory cells. The signal WCW may write an entire set (or ECC codeword) into the circuit 94. The signal RCW may read an entire set (or ECC codeword) from the circuit 94.

In various embodiments, one or more types of nonvolatile storage devices may be used to implement the circuit 94. Such nonvolatile devices include, but are not limited to, SLC NAND flash memory, MLC NAND flash memory, NOR flash memory, flash memory using polysilicon or silicon nitride technology-based charge storage cells, two-dimensional or three-dimensional technology-based flash memory, ferromagnetic memory, phase-change memory, racetrack memory, resistive random access memory, magnetic random access memory and similar types of memory devices and/or storage media.

The circuit 100 may implement a controller circuit. The circuit 100 is generally operational to control reading to and writing from the circuit 94. The circuit 100 may be implemented as one or more integrated circuits (or chips or die) in any controller used for controlling one or more solid state drives (e.g., SSD), embedded storage, or other suitable control applications.

In various embodiments, as part of a read access to the circuit 94, the circuit 100 may specify and/or generate the reference voltage in the signal VREF. The reference voltage may be adjusted based on channel parameters (or read parameters) of the circuit 94 to minimize a read error rate. Adjustments of the channel parameters may be performed based on each "online" read. An online read generally means that the read takes place because the circuit 92 has requested the read data and/or the circuit 100 is performing maintenance on the circuit 94. An "offline" read may be considered a read used to measure and/or update the channel parameters (e.g., no data is presented to the circuit 92) and generally involves reading the same group of cells multiple times with different reference voltages.

The circuit 100 may also include an error correction coding (e.g., ECC) capability and an error detection and correction (e.g., EDC) capability. The error correction coding may be used to add additional bits to sets of data received in the signal WDATA. The extra bits generally enable the detection and ultimate correction of one or more bits that may become corrupted between a write and one or more subsequent reads. The ECC data (e.g., the original data plus the extra bits) may be presented in the signal WCW.

The error detection and correction capability may provide an ability to detect when one or more bits in the signal RCW have been corrupted (e.g., flipped). The error detection and correction capability may also correct a limited number of the corrupted bits. The corrected data may be presented in the signal RDATA. The error detection and correction feature may also generate statistics concerning read error rates experienced in the raw read data received in the signal RCW.

Figure 2:
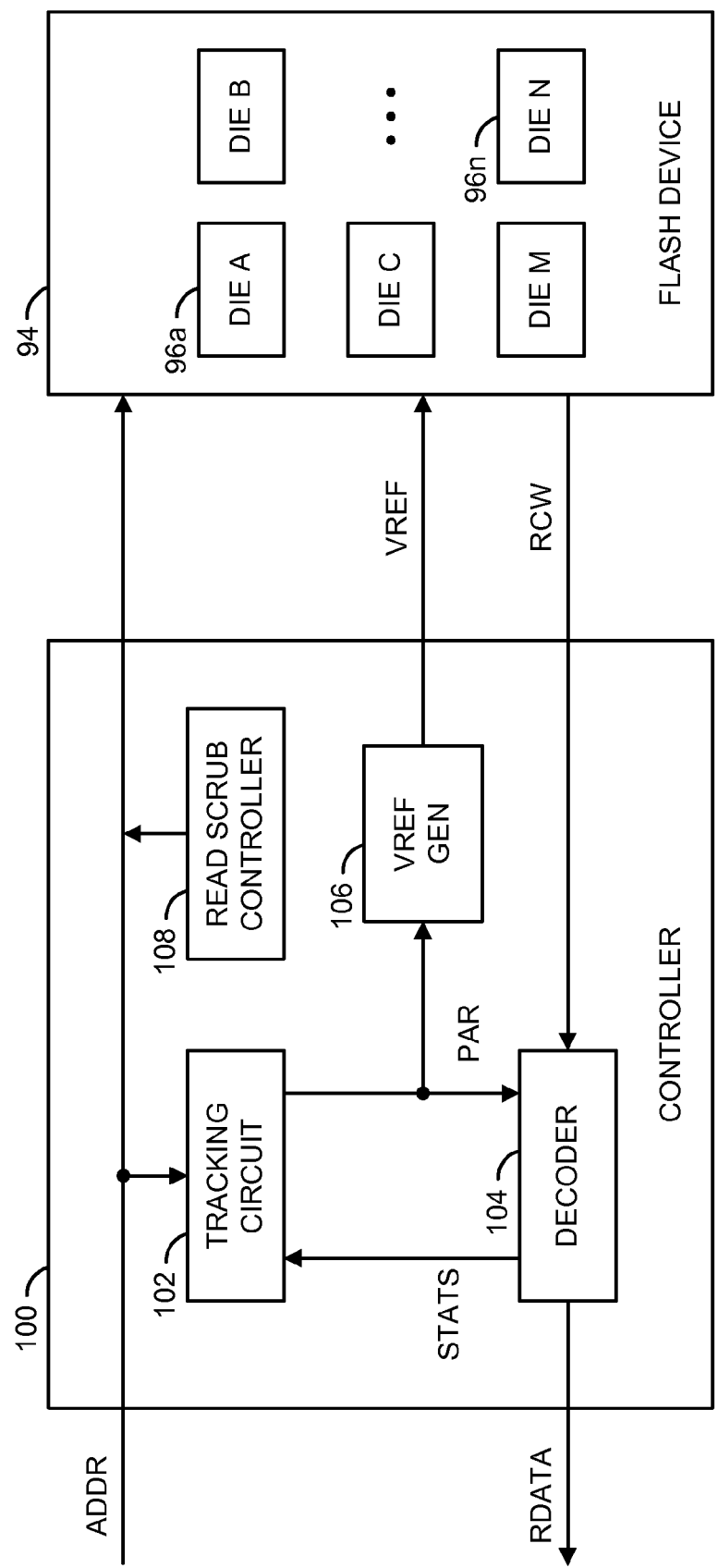
FIG. 2 is a block diagram of an example implementation of a controller in the apparatus in accordance with a preferred embodiment of the present invention.

Referring to FIG. 2, a block diagram of an example implementation of the circuit 100 is shown in accordance with a preferred embodiment of the present invention. The circuit 100 generally comprises a block (or circuit) 102, a block (or circuit) 104, a block (or circuit) 106 and a block (or circuit) 108. The circuit 94 may comprise multiple blocks (or circuits) 96a-96n. The circuits 96a to 108 may represent modules and/or blocks that may be implemented as hardware, software, a combination of hardware and software, or other implementations.

The signal ADDR may be received by the circuits 94 and 102. The signal VREF may be generated by the circuit 106. The signal RCW may be received by the circuit 104. The circuit 104 may generate the signal RDATA. A signal (e.g., STATS) may be generated by the circuit 104 and transferred to the circuit 102. The signal STATS may convey one or more pieces of status information concerning a decode of the ECC codewords received in the signal RCW and one or more statistics of the signal RCW. The circuit 102 may generate a signal (e.g., PAR) received by the circuit 106, and optionally received by the circuit 104. The signal PAR may carry multiple parameters that characterize the read channel (e.g., NAND flash channel) properties of the circuit 94. The circuit 108 may also generate the signal ADDR as part of read scrub operations.

Each circuit 96a-96n may implement a nonvolatile memory device. In some embodiments, each circuit 96a-96n may be fabricated as an individual die (or chip). Each circuit 96a-96n generally comprises multiple memory cells.

Each memory cell may store a single bit (in SLC type memory) or multiple bits (in MLC, TLC and/or other higher multi-bit type memories). Multiple bits are generally grouped into pages, word lines, blocks or the like. In some embodiments, a single group may span an entire circuit 96a-96n. Due to noise, the actual threshold voltage of each memory cell may be different. Therefore, the expressed threshold voltages of each group of memory cells generally form a distribution. Each distribution of the threshold voltages may be defined by the channel parameters (e.g., a mean threshold voltage $\mu$ and a standard deviation $\sigma$ from the mean threshold voltage). The different channels may be treated independently of each other, depending on a tracking granularity. For example, different blocks in the same nonvolatile memory die (e.g., circuit 96a) may exhibit different channel parameters (e.g., different threshold voltage distributions).

The circuit 102 may implement a tracking circuit. The circuit 102 is generally operational to track and update the read channel (e.g., memory channel) parameters (or properties) in response to an error correction applied to a set of data read from the circuit 94. In some embodiments, the channel parameters may be tracked separately for each region (e.g., R-blocks) and each unit (e.g., outlier blocks) of memory cells. For MLC, TLC and/or other multi-bit type memories having four of more states per memory cell, the circuit 102 may also be configured to extrapolate the channel parameters corresponding to the outer states based on changes in the parameters corresponding to the middle two states. The channel parameters for the group containing the current set of memory cells being read may be presented in the signal PAR.

The circuit 104 may implement a decoder circuit. The circuit 104 is generally operational to decode (or error detect and correct) each set of data received in the signal RCW. The corrected data may be presented in the signal RDATA. The statistics may be gathered before and/or during the correction by the circuit 104. The statistics generally include, but are not limited to, one or more of a total number of zero data bits in the scrambled data received from the circuit 94, a total number of one bits in the scrambled data received from the circuit 94, a total number of zero data bits in the corrected set, a total number of one data bits in the corrected set, a total number of bits corrected from zero to one, a total number of bits corrected from one to zero, other statistics, and any function and/or combination thereof. The statistics may be presented in the signal STATS.

To counteract noise, the data stored in the circuit 94 is usually error correction coded. Decoding is generally performed by the circuit 104 when reading the ECC data from the circuit 94. In some embodiments, ECC encoding is paired with hard-decision decoders, such as Bose, Ray-Chaudhuri and Hocquenghem (e.g., BCH) decoders and hard-decision Reed-Solomon decoders. In some embodiments, soft decision decoders, such as Viterbi decoders for convolutional codes and soft decoders for low density parity check (e.g., LDPC) codes may be implemented in the circuit 104.

The circuit 106 may be implemented as a reference voltage circuit. The circuit 106 is generally operational to specify or generate a variable reference voltage used by the circuit 94 in reading a set of data from the circuit 94. The circuit 106 may also be operational to adjust the reference voltage via the signal VREF based on one or more updated channel parameters received from the circuit 102 in the signal PAR. For example, the circuit 106 may adjust the reference voltage higher or lower to track a shift in a mean threshold voltage of a group. Adjusting the reference voltage generally lowers an error rate in subsequent reads from the circuit 94.

The circuit 108 may implement a read scrub controller circuit. The circuit 108 is generally operational to initiate read scrub operations on the circuit 94. The circuit 108 may determine a frequency and/or a sequence of the read scrubs, and issue reads of certain pages in the circuit 94 when a (background) read scrub is initiated. The pages being scrubbed may be identified by the address values presented in the signal ADDR. The circuit 108 may also be operational to determine what to do if the ECC decoding of the read scrub data fails or if the ECC decoding succeeds but a significant number of errors were corrected in a codeword (or any other granularity, such as a page, a block, etc.). Each codeword having one or more correctable errors may be corrected by the circuit 104 and subsequently rewritten into the circuit 94.

In some embodiments, the channel parameters may be useful in lowering an overall read error rate. For example, knowledge of the channel parameters may help the circuit 100 to determine a more optimized reference voltage when reading from the circuit 94. Due to retention, the threshold voltage distributions may drift away from the original distributions. Without knowing the drifts, a fixed reference voltage may eventually lead to more read errors, which may exceed the error correction capability of the circuit 104 and therefore lead to read failures.

Knowledge of the channel parameters may also help the circuit 100 determine better decoding parameters. For example, in implementations of the circuit 104 that have an LDPC decoder with a log likelihood ratio (e.g., LLR) type of decoder input, the changes in threshold voltage distributions may result in changes to the LLR computation for the decoder. Without knowing the channel parameters, the LLR computation may become sub-optimal thus leading to poor decoding performance.

Measurements of the channel parameters for each group may be performed online and/or offline. The offline tracking generally utilizes additional reads intended for channel tracking purposes. The online channel tracking generally does not utilize the additional reads. For example, if the circuit 100 is issuing a read due to a read request from the circuit 92, such a read is generally not considered an additional read. If the circuit 100 is issuing a read for maintenance purposes, such as moving a partially written block, such reads are generally not considered additional reads. Because each nonvolatile memory read involves performance hits in latency/throughput/power, the online channel tracking may have a higher performance than the offline channel tracking.

The offline measurements may be a straightforward way of determining the threshold voltage distributions of each group. Directly measuring the threshold voltage distributions generally involves many reads on each group of memory cells, because the circuit 100 generally supports hard-decision reads. If the circuit provides direct soft reads through an analog-to-digital converter (e.g., ADC), some channel tracking may be capable, although possibly limited due to the finite precision of the ADC. The online channel tracking is generally achieved with fewer reads than the offline tracking.

The circuit 108 generally monitors P/E cycle counts (e.g., PEC) of each R—block (or region). Assuming that the channel conditions only change gradually throughout the life of the circuit 94, the circuit 108 may choose to initiate online channel tracking only when the PEC of a particular R-block is larger than the PEC of that particular R-block in a last channel parameter update by a certain threshold (e.g., Tpec). The threshold Tpec may be a fixed value (e.g., 100 P/E cycles) or may be made dynamic. For instance, the threshold Tpec may be smaller when the device is young and larger when the device is near an end of life. Additional details regarding high-level redundancy information computations for the R-blocks may be found in WIPO publication WO 2012/099937 A2, which is hereby incorporated by reference in its entirety.

Figure 3:
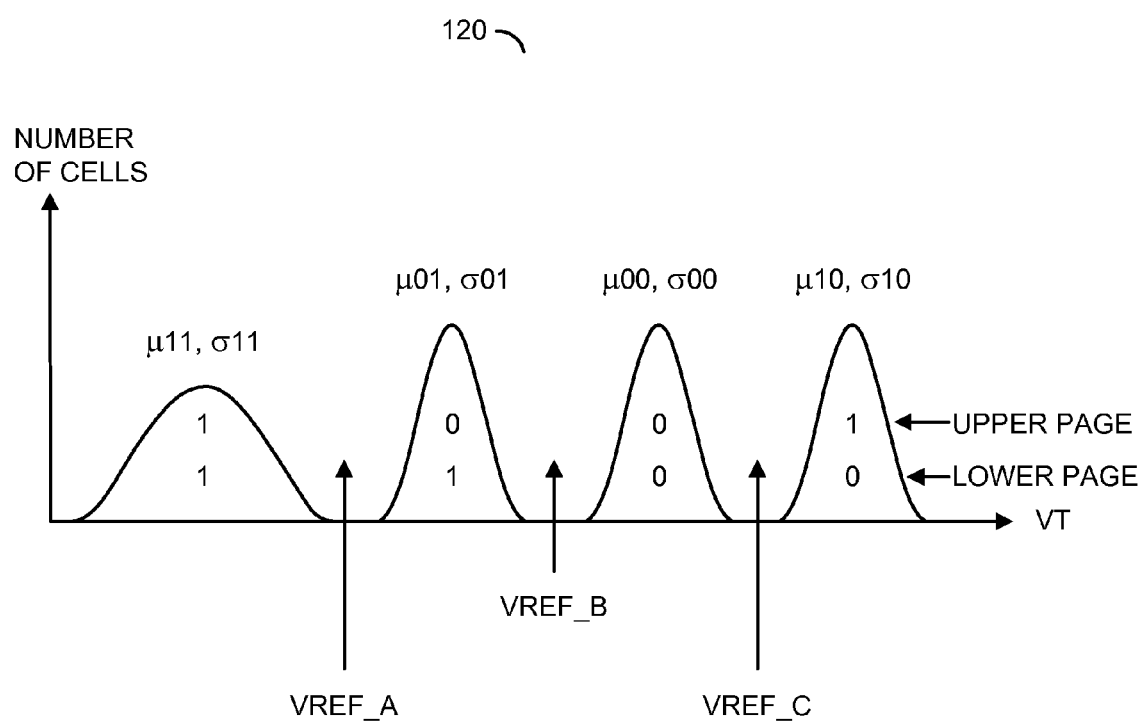
FIG. 3 is a graph of example multi-level cell threshold voltage distributions.

Referring to FIG. 3, a graph of example MLC threshold voltage distributions 120 is shown. The threshold voltages for each state are generally modeled as a Gaussian random variable. Each Gaussian distribution about a state may be characterized as a mean ($\mu$) and a standard deviation ($\sigma$). In the MLC example, four means (e.g., $\mu 11$, $\mu 01$, $\mu 00$ and $\mu 10$) and four standard deviations (e.g., $\sigma 11$, $\sigma 01$, $\sigma 00$ and $\sigma 10$) may be used to model a channel.

The channel tracking during read scrub technique may be useful for the MLC type devices and other devices with more than one bit per cell, such as the TLC type devices. In an MLC device, each memory cell generally stores multiple (e.g., 2) bits and utilizes more than 2 (e.g., 4) Vt levels. In some nonvolatile memories, gray mapping may be used to map the bit values to the Vt levels. The multiple bits in each memory cell generally reside in multiple (e.g., 2) pages: a lower page and an upper page. For channel tracking purposes, read scrub on the lower page may provide useful statistics about the center reference voltage (e.g., voltage VREF_B). However, for an upper page read, typical directional statistics used in online tracking such as the 0/1 disparity and directional correction count may not be as simple. For example, bit flips (e.g., 0→1 and 1→0) may be corrected in opposite directions about voltage VREF_A as compared with voltage VREC_C.

To solve the opposite direction problem for MLC online tracking, a read scrub buffer may be implemented in the circuit 104 to temporarily store the decoded lower page in the same word line as the upper page. With the lower page known, the circuit 104 may be able to synthesize statistics based on both the upper page read results and the lower page read results, either before or after decoding or both.

Figure 4:
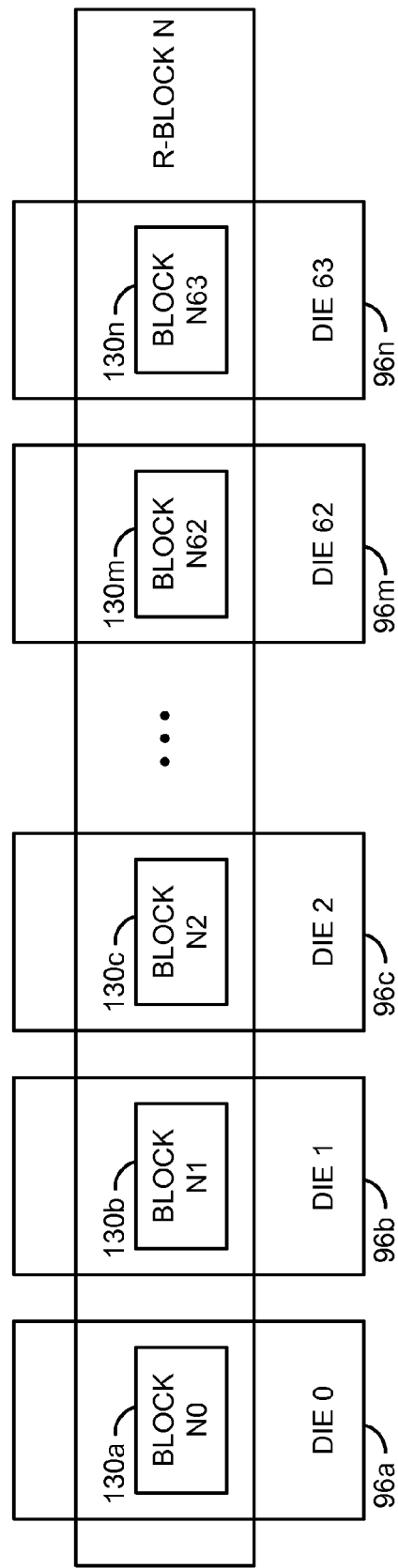
FIG. 4 is a block diagram of an example R-block.

Referring to FIG. 4, a block diagram of an example R-block N is shown. The R-block N generally comprises multiple blocks (or units) 130a-130n (e.g., N0-N63). Each block 130a-130n is generally fabricated on a different one of the dies 96a-96n (e.g., Die 0-Die 63). In some situations, the R-block N may have a fewer number of blocks 130a-130n than the number of dies 96a-96n. In other situations, the R-block N may have a larger number of blocks 130a-130n than the number of dies 96a-96n.

At a start of the life of the R-block N, all of the blocks 130a-130n may be read using a single set of average channel parameters. Over time and as the R-block N is programmed and erased, one or more blocks (e.g., blocks 130c and 130m) may be identified as an outlier block. Therefore, each outlier block may be accessed with a customized set of outlier channel parameters. If a previously-identified outlier block shifts back into the range of the average channel parameters, the outlier block may again be treated as part of the region.

By applying the R-block as the coarse granularity, circuit 100 may provide a fault tolerant capability that allows for the loss of one or more blocks 130a-130n (or the corresponding die 96a-96n). The circuit 100 may be operational to generate redundant information (e.g., parity information) from the data being stored in the R-block N. The redundant information generally allows reconstruction of the data in the event that one or more of the blocks 130a-130n fails and/or loses power. The data reconstruction may be similar to the reconstruction in a redundant array of independent disk (e.g., RAID) hard disk drive. The redundant information may be stored in one or more of the blocks 130a-130n of the R-block N. The fault tolerance of the redundant information may be adjustable. For example, a single redundant block (e.g., 130a) may be used to store redundant information sufficient to recover from the loss of a single block 130b-130n. Two redundant blocks (e.g., 130a-130b) may be used to recover from the loss of two blocks 130c-130n. Where the redundant information is a mirror copy of the data (e.g., RAID 0), half the blocks 130a-130n may store the data and the other half stores the mirrored copy of the data.

Figure 5:
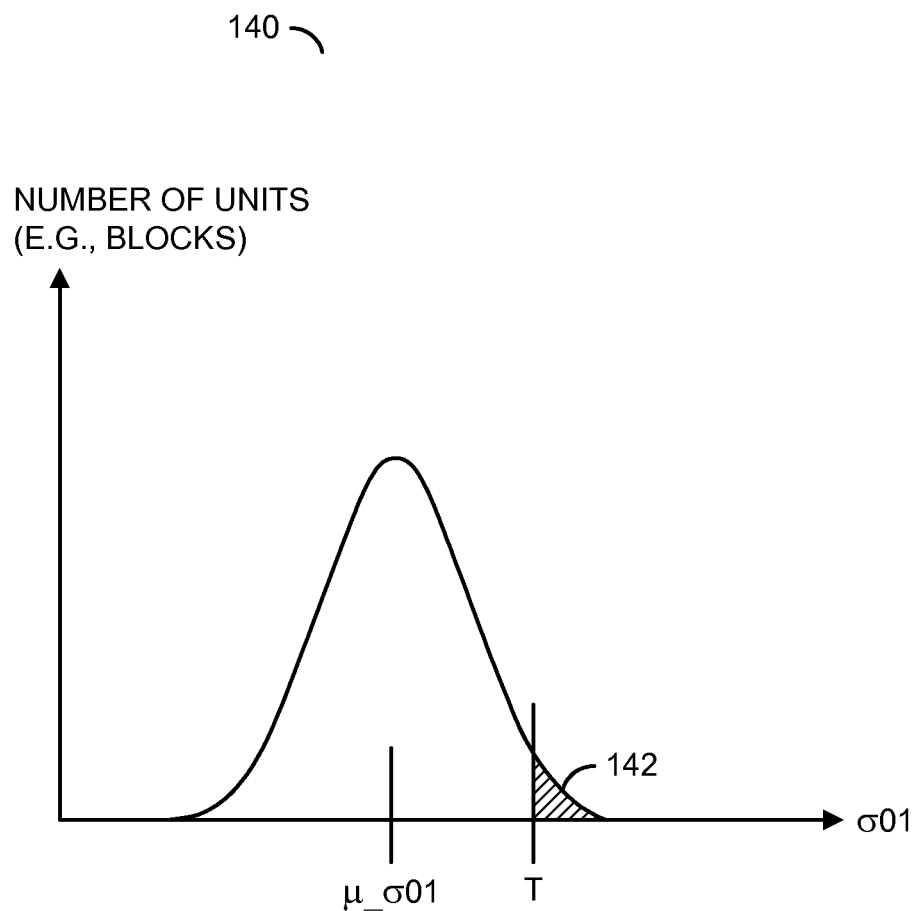
FIG. 5 is a graph of an example distribution of a state within an R-block.

Referring to FIG. 5, a graph of an example distribution 140 of a state within an R-block is shown. The channel parameters generally vary within a given granularity. The circuit 100 may account for one or more poor channel conditions that may cause a high error rate. The blocks 130a-130n associated with the poor channel conditions may be defined as the outliers. For example, a standard deviation of a threshold voltage (e.g., Vt) for a state "01" may be different for each block 130a-130n within the R-block N (or group of blocks). The distribution 140 of $\sigma 01$ may be modeled as a Gaussian distribution. The blocks with large standard deviations may be more likely to have read errors than the blocks with small standard deviations. The blocks 130a-130n having threshold voltage standard deviations at the upper edge of the distribution 140 may also be more likely to cause read errors than blocks 130a-130n having threshold voltage standard deviations near a mean value).

The distribution 140 generally has a mean value (e.g., $\mu\_\sigma 01$) and a standard deviation (e.g., $\sigma\_\sigma 01$). A threshold (e.g., T) may be established for the distribution 140. The threshold T generally distinguishes between the blocks 130a-130n within the R-block N that should be read using the average channel parameters (e.g., $\sigma 01 < T$) and the blocks 130a-130n that should be treated as outliers (e.g., in the region 142). In some configuration, the threshold T may be a standard deviation away from the mean value $\mu\_\sigma 01$ (e.g., $T=\mu\_\sigma 01+\sigma\_\sigma 01$). In other configurations, the threshold T may be a fixed offset voltage from the mean value $\mu\_\sigma 01$. Other techniques may be used to determine where the threshold T is located to meet the criteria of a particular application. A small percentage of outliers generally exist in a normal SSD. By utilizing the read scrub operations, the circuit 100 may be able to identify and manage the outliers.

Figure 6:
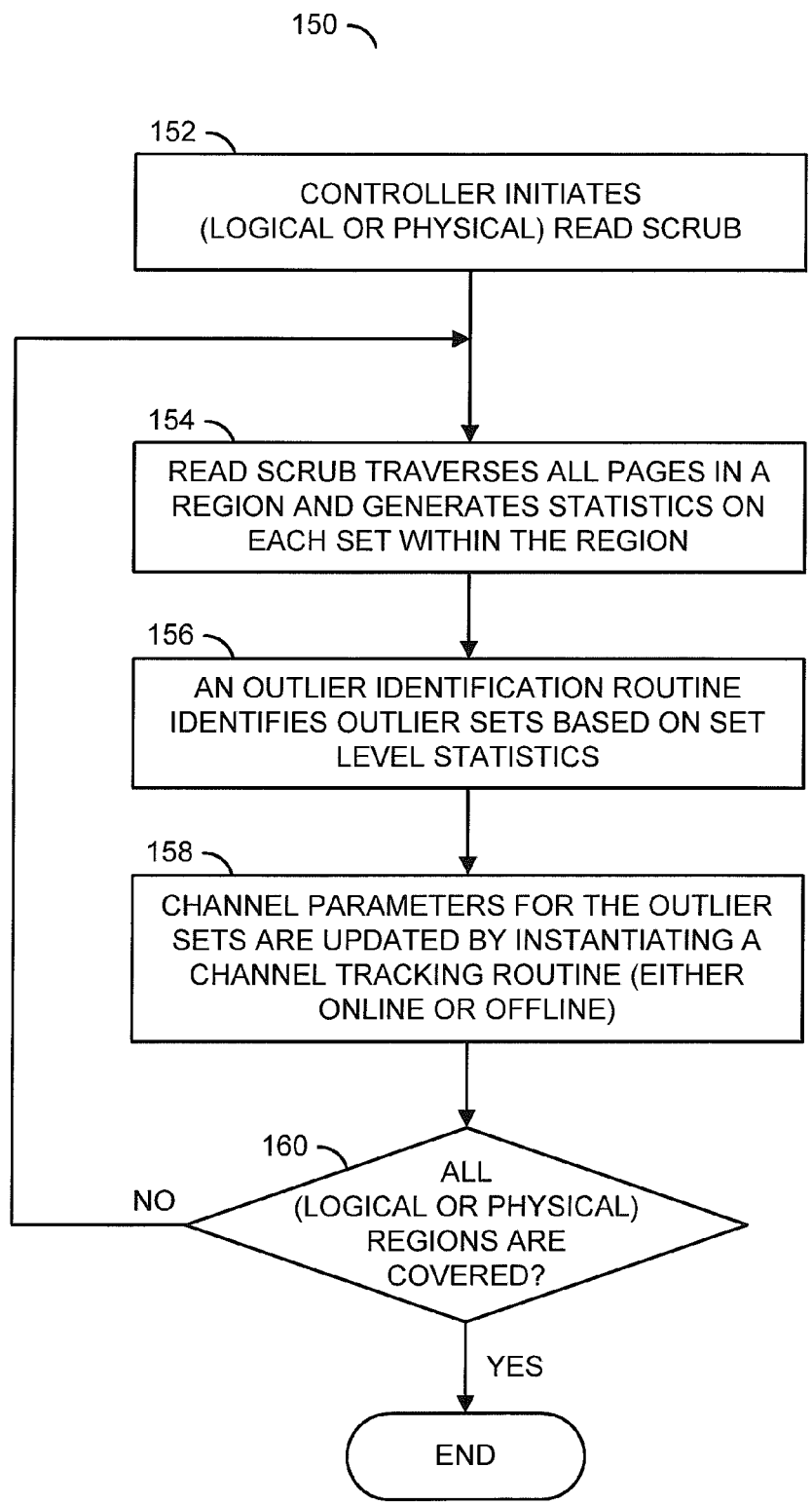
FIG. 6 is a flow diagram of an example method for channel tracking at multiple granularities.

Referring to FIG. 6, a flow diagram of an example method 150 for channel tracking at multiple granularities is shown. The method (or process) 150 may be implemented in the controller 100. The method 150 generally comprises a step (or state) 152, a step (or state) 154, a step (or state) 156, a step (or state) 158 and a step (or state) 160. The steps 152-160 may represent modules and/or blocks that may be implemented as hardware, software, a combination of hardware and software, or other implementations.

The method 150 may use an R-block (e.g., region) as the average granularity and a block (e.g., unit) as the outlier granularity. Other granularity combinations may be utilized to meet the criteria of a particular application. For example, the average granularity may be 100 R-blocks and the outlier granularity may be an R-block. In another example, the average granularity may be 10 R-blocks and the outlier granularity may be a block.

In the step 152, the circuit 100 (e.g., circuit 108) may initiate a read scrub of a logical region or a physical region in the circuit 94. The read scrub generally reads from all pages (or all pages with data written) within the region and generates the statistics corresponding to each unit in the step 154. The circuit 100 may aggregate ECC coded page-level (or wordline-level) statistics for the region statistics. The circuit 100 may also gather statistics on previously-identified (old) outlier blocks. The statistics may be based on hard-decision reads. If decoding fails, the page may enter a recovery operation with multiple reads.

In the step 156, the circuit 100 (e.g., the circuit 102) may identify new outlier units based on the unit-level statistics generated as part of the read scrub. The circuit 100 may update a collection of channel parameters for the old and new outlier units in the step 158. The statistics for the outlier units may be separated from the statistics for the rest of the region. Thereafter, the circuit 100 may track the outlier units and the region individually. A check may be performed in the step 160 to determine if all of the regions in the circuit 94 have been covered by the current read scrub operation. If not, the method 150 may return to the step 154 and continue with a read scrub of a next region. Otherwise, the method 150 may end.

Error statistics generated during a read scrub may also be used to identify the outliers. Consider a configuration in which each unit is a block. If a total number of pages in a block that enter a recovery operation exceeds a threshold, the block is generally identified as an outlier. In another example, if an average corrected error count per page exceeds another threshold, the block is generally identified as an outlier.

Referring to Table I, a comparison of the hybrid channel parameter management scheme versus simple tracking schemes is shown as follows:

TABLE I

| Scheme | Memory Utilization | | | | Channel Condition Coverage |
| --- | --- | --- | --- | --- | --- |
| | Average Parameter | Outlier Parameter | Outlier Locations | Total Parameters | |
| Block Granularity | 1 MB | N/A | N/A | 1 MB | Very Good |
| R-block Granularity | 16 KB | N/A | N/A | 16 KB | Moderate |
| Hybrid Scheme | 16 KB | ~31 KB | ~15 KB | ~62 KB | Very Good |

The parameters for creating Table I generally include a 256 GB SSD, each block has 2 MB, 64 blocks per R-block, a single set of parameters each unit takes 8 bytes, an address to each block takes 4 bytes, and approximately 3% of the blocks in the R-block may be outliers that have a worse channel condition than the average channel parameters of the R-block. Based on Table I, implementation of the hybrid scheme generally provides a performance similar to a fine granularity scheme but consumes a significantly smaller amount of memory.

The hybrid management scheme may be extended to other flash media related parameters in the circuit 100. The other related parameters may include, but are not limited to, one or more of (i) the reference voltages used in normal reads, (ii) an ECC code rate (e.g., a ratio of user bits to total bits) and (iii) a read disturb count. Due to changes in the flash channel conditions, the reference voltages used in normal reads may not be the same for each page/block/R-block. An optimal reference voltage used in a hard-decision normal read is generally a function of the channel parameters. By tracking individual parameters for the outlier units and the regions and applying an appropriate reference voltage for the outlier unit or region, a lower error rate may be achieved compared with using just a single collection (or set) of channel parameters.

For the ECC code rate, the circuit 100 may choose to use different ECC code rates for different pages/blocks/R-blocks. A lower code rate may be used to protect pages with worse channel conditions. Thus, the code rate used in the region may be based on the average channel parameters to achieve a high data storage density. Conversely, lower code rates may be used in the outlier units to achieve a lower error rate during normal reads.

Figure 7:
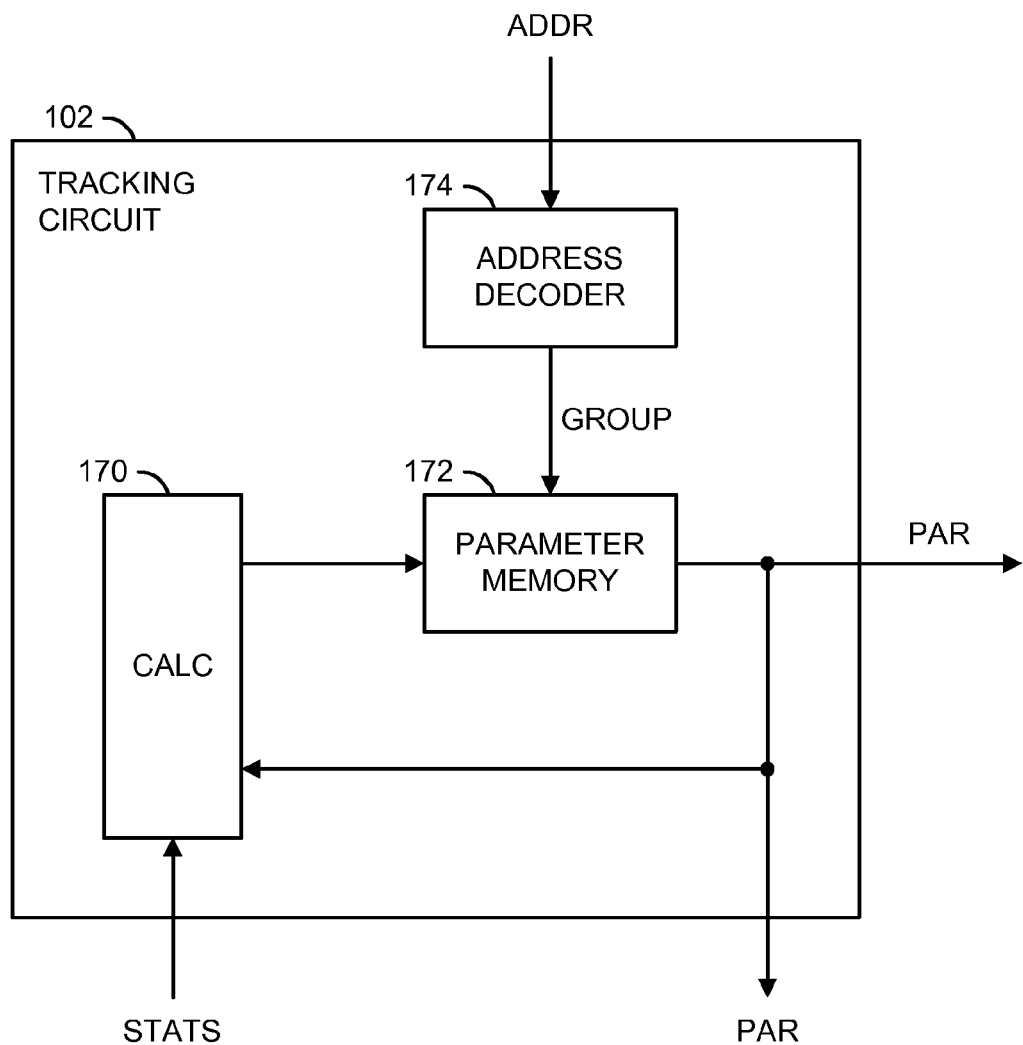
FIG. 7 is a block diagram of an example implementation of a channel tracking circuit in the controller.

Referring to FIG. 7, a block diagram of an example implementation of the circuit 102 is shown. The circuit 102 generally comprises a block (or circuit) 170, a block (or circuit) 172 and a block (or circuit) 174. The circuits 170 to 174 may represent modules and/or blocks that may be implemented as hardware, software, a combination of hardware and software, or other implementations.

The signal ADDR may be received by the circuit 174. The signal STATS may be received by the circuit 170. The signal PAR may be generated by the circuit 172 and received by the circuit 170. A signal (e.g., GROUP) may be generated by the circuit 174 and received by the circuit 172. The signal GROUP may identify which particular group in the circuit 94 is being accessed.

The circuit 170 may implement a calculation circuit. The circuit 170 is generally operational to update the channel parameters based on the statistics received in the signal STATS and the current channel parameters received in the signal PAR. The updated channel parameters may be transferred to the circuit 172.

The circuit 172 may implement a parameter memory circuit. The circuit 172 is generally operational to store the channel parameters for each group. The current parameters for the current group (identified in the signal GROUP) may be read and presented in the signal PAR. Updated parameters for the current group received from the circuit 170 may be stored. In some embodiments, the channel parameters may be copied from time to time to the circuit 94 for nonvolatile storage while power is removed. When power is returned, the channel parameters may be copied from the circuit 94 back to the circuit 172.

The circuit 174 may implement an address decoder circuit. The circuit 174 is generally operational to decode the address value received in the signal ADDR into a particular group within the circuit 94. A decoded group value (or identification) may be transferred to the circuit 172 in the signal GROUP.

The threshold voltage distributions in the SLC type memories may be obtained by reading each block 130a-130n multiple times with different reference voltages. By scanning a range of the reference voltages and collecting the number of one bits (or zero bits) in each read, a histogram may be established for the number of cells in each scanned reference voltage range. The histogram may be directly translated into the threshold voltage distribution parameters. Additional details about the threshold voltage distribution parameters for nonvolatile memory may be found in co-pending U.S. application Ser. Nos. 13/464,433 and 13/533,130 which are hereby incorporated by reference in their entirety.

Some embodiments of the present invention provide a hybrid channel parameter management scheme for use in a solid state drive controller. An average granularity may be chosen by the controller such that a single collection of average channel parameters is used for each unit at the region granularity. A small percentage of outliers at a smaller granularity may be identified and each one has a respective collection of channel parameters. Read scrubs may be run regularly throughout life of the solid state drive. Based on statistics output from each read scrub, an outlier identification operation (or module) generally identifies the outlier units. Existing online and offline channel tracking methods may be used to track both the average channel parameters and the outlier channel parameters. The management scheme generally covers channel condition variations within a given granularity with both average and outlier channel parameters. The management scheme may utilize smaller memory and computation resources than using a single set of parameters for each unit at the outlier granularity.

The functions performed by the diagrams of FIGS. 1-7 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

The present invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The present invention thus may also include a computer product which may be a storage medium or media and/or a transmission medium or media including instructions which may be used to program a machine to perform one or more processes or methods in accordance with the present invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to the preferred embodiments thereof, it will be understood by those skilled in the art that various changes in form and details may be made without departing from the scope of the invention.

The invention claimed is:

1. An apparatus comprising:
a memory configured to store data; and
a controller configured to
  process a plurality of input/output requests to read/write to/from the memory,
  generate a plurality of statistics of a plurality of units in a region of the memory as part of a read scrub of the region, wherein the statistics comprise at least one of a total number of bits having a first logical value before a correction made during the read scrub, a total number of bits having the first logical value after the correction, or a total number of bits changed from a second logical value to the first logical value by the correction,
  track a plurality of channel parameters that characterize the region based on the plurality of statistics, wherein the plurality of channel parameters comprise a plurality of mean threshold voltages of the units in the region and a plurality of standard deviations from the mean threshold voltages, and when one or more of the statistics exceeds a corresponding threshold,
separate one or more outlier units from the plurality of units in the region,
separate one or more outlier statistics from the plurality of statistics of the region,
track a plurality of outlier channel parameters that characterize the one or more outlier units based on the one or more outlier statistics, wherein the plurality of outlier channel parameters comprise the mean threshold voltages and the standard deviations from the mean threshold voltages of the one or more outlier units, and the plurality of outlier channel parameters are tracked separately from the tracking of the plurality of channel parameters that characterize the region, and
control one or more reference voltages in the memory based on the plurality of outlier channel parameters when reading the data a plurality of times from the one or more outlier units and based on the plurality of channel parameters that characterize the region when reading the data a plurality of times from the units of the region other than the one or more outlier units.

2. The apparatus according to claim 1, wherein the region spans a plurality of die that form the memory, and each of the plurality of units in the region comprises a block having a plurality of memory cells.

3. The apparatus according to claim 2, wherein one or more of the blocks in the region are designated to store redundancy information configured to recover from a failure of one or more of the blocks in the region.

4. The apparatus according to claim 1, wherein the controller is further configured to separate the one or more outlier statistics of the one or more outlier units from the plurality of statistics of the region while tracking the plurality of channel parameters that characterize the region.

5. The apparatus according to claim 1, wherein the corresponding threshold comprises a threshold voltage displacement relative to the mean threshold voltages in the region.

6. The apparatus according to claim 1, wherein the corresponding threshold comprises a threshold voltage spread relative to the standard deviations in the region.

7. The apparatus according to claim 1, wherein the corresponding threshold comprises a read error rate threshold.

8. The apparatus according to claim 1, wherein the corresponding threshold comprises a read disturb count threshold.

9. The apparatus according to claim 1, wherein the memory and the controller are part of a solid-state drive.

10. A method for channel parameter management with read scrub, comprising the steps of:
generating a plurality of statistics of a plurality of units in a region of a memory as part of the read scrub of the region, wherein the statistics comprise at least one of a total number of bits having a first logical value before a correction made during the read scrub, a total number of bits having the first logical value after the correction, or a total number of bits changed from a second logical value to the first logical value by the correction;
tracking a plurality of channel parameters that characterize the region based on the plurality of statistics, wherein the plurality of channel parameters comprise a plurality of mean threshold voltages of the units in the region and a plurality of standard deviations from the mean threshold voltages; and
when one or more of the statistics exceeds a corresponding threshold,
separating one or more outlier units from the plurality of units in the region,
separating one or more outlier statistics from the plurality of statistics of the region,
tracking a plurality of outlier channel parameters that characterize the one or more outlier units based on the one or more outlier statistics, wherein the plurality of outlier channel parameters comprise the mean threshold voltages and the standard deviations from the mean threshold voltages of the one or more outlier units, and the plurality of outlier channel parameters are tracked separately from the tracking of the plurality of channel parameters that characterize the region, and
controlling with a circuit one or more reference voltages in the memory based on the plurality of outlier channel parameters when reading data a plurality of times from the one or more outlier units and based on the plurality of channel parameters that characterize the region when reading the data a plurality of times from the units of the region other than the one or more outlier units.

11. The method according to claim 10, wherein the region spans a plurality of die that form the memory, and each of the plurality of units in the region comprises a block having a plurality of memory cells.

12. The method according to claim 11, wherein one or more of the blocks in the region are designated to store redundancy information configured to recover from a failure of one or more of the blocks in the region.

13. The method according to claim 10, further comprising the step of:
separating the one or more outlier statistics of the one or more outlier units from the plurality of statistics of the region while tracking the plurality of channel parameters that characterize the region.

14. The method according to claim 10, wherein the corresponding threshold comprises a threshold voltage displacement relative to the mean threshold voltages in the region.

15. The method according to claim 10, wherein the corresponding threshold comprises a threshold voltage spread relative to the standard deviations in the region.

16. The method according to claim 10, wherein the corresponding threshold comprises a read error rate threshold.

17. The method according to claim 10, wherein the corresponding threshold comprises a read disturb count threshold.

18. The method according to claim 10, wherein the steps are performed in a solid-state drive.

19. An apparatus comprising:
an interface configured to process a plurality of read/write operations to/from a memory; and
a control circuit configured to
generate a plurality of statistics of a plurality of units in a region of the memory as part of a read scrub of the region, wherein the statistics comprise at least one of a total number of bits having a first logical value before a correction made during the read scrub, a total number of bits having the first logical value after the correction, or a total number of bits changed from a second logical value to the first logical value by the correction, track a plurality of channel parameters that characterize the region based on the plurality of statistics, wherein the plurality of channel parameters comprise a plurality of mean threshold voltages of the units in the region and a plurality of standard deviations from the mean threshold voltages, and when one or more of the statistics exceeds a corresponding threshold,
- separate one or more outlier units from the plurality of units in the region,
- separate one or more outlier statistics from the plurality of statistics of the region,
- track a plurality of outlier channel parameters that characterize the one or more outlier units based on the one or more outlier statistics, wherein the plurality of outlier channel parameters comprise the mean threshold voltages and the standard deviations from the mean threshold voltages of the one or more outlier units, and the outlier channel parameters are tracked separately from the tracking of the plurality of channel parameters that characterize the region, and
- control one or more reference voltages in the memory based on the plurality of outlier channel parameters when reading data a plurality of times from the one or more outlier units and based on the plurality of channel parameters that characterize the region when reading the data a plurality of times from the units of the region other than the one or more outlier units.

20. The apparatus according to claim 19, wherein the interface and the control circuit are part of a solid-state drive controller.

* * * * *